United States Patent
Park et al.

(10) Patent No.: US 7,206,124 B2
(45) Date of Patent: Apr. 17, 2007

(54) GAIN-PROVIDING OPTICAL POWER EQUALIZER

(75) Inventors: Nam-Kyoo Park, Seoul (KR); Jung-Hoon Shin, Daejon (KR)

(73) Assignee: Luxpert Technologies Co., Ltd., Gwanak-gu, Seoul (KR)

( * ) Notice: Subject to any disclaimer, the term of this patent is extended or adjusted under 35 U.S.C. 154(b) by 81 days.

(21) Appl. No.: 10/508,357

(22) PCT Filed: Mar. 20, 2003

(86) PCT No.: PCT/KR03/00520

§ 371 (c)(1),
(2), (4) Date: Sep. 16, 2004

(87) PCT Pub. No.: WO03/079586

PCT Pub. Date: Sep. 25, 2003

(65) Prior Publication Data

US 2005/0128569 A1 Jun. 16, 2005

(30) Foreign Application Priority Data

Mar. 20, 2002 (KR) .................... 10-2002-0014996

(51) Int. Cl.
*H01S 3/00* (2006.01)
*H04B 10/12* (2006.01)
(52) U.S. Cl. .............................. 359/341.32; 359/341.33
(58) Field of Classification Search ........... 359/341.32, 359/341.33
See application file for complete search history.

(56) References Cited

U.S. PATENT DOCUMENTS

| 5,815,309 | A | | 9/1998 | Lawrence et al. | .......... 359/343 |
|---|---|---|---|---|---|
| 5,847,865 | A | | 12/1998 | Gopinath et al. | ........... 359/333 |
| 5,930,013 | A | * | 7/1999 | Fatehi et al. | ................... 398/45 |
| 6,219,163 | B1 | * | 4/2001 | Miyazaki et al. | ............... 398/9 |
| 6,490,388 | B1 | * | 12/2002 | Manzur | ....................... 385/27 |
| 6,608,951 | B1 | * | 8/2003 | Goldberg et al. | ............. 385/43 |
| 6,697,193 | B1 | * | 2/2004 | Meli et al. | ................... 359/349 |
| 6,842,570 | B2 | * | 1/2005 | Komine | ....................... 385/43 |
| 6,901,194 | B2 | * | 5/2005 | Charlton et al. | ............ 385/122 |
| 2005/0152427 | A1 | * | 7/2005 | Shin et al. | ..................... 372/70 |

FOREIGN PATENT DOCUMENTS

| WO | 0918405 A1 | 5/1999 |
|---|---|---|
| WO | 1083642 A2 | 3/2001 |
| WO | WO 3076972 A1 * | 9/2003 |
| WO | WO 3076988 A1 * | 9/2003 |

OTHER PUBLICATIONS

Fei et al., IEEE Photonics Technology Letters, vol. 11, No. 9; A Novel Scheme of Power Equalization and Power Management in WDM All-Optical Networks, Sep. 1999, pp. 1189-1191.

* cited by examiner

*Primary Examiner*—Deandra M. Hughes
(74) *Attorney, Agent, or Firm*—Marger Johnson & McCollom, P.C.

(57) ABSTRACT

Disclosed is a gain-providing optical power equalizer which can equalize optical channel output or gain while amplifying signal output. In prior art technologies, optical power equalization has been achieved by attenuating signal output differently depending upon optical channels. However, the optical power equalizer of the present invention is characterized in that it achieves equalization of optical power by giving optical gain differently depending upon optical channels. According to the present invention, the output of optical channels can be adjusted to be flat or as desired without deteriorating signal to noise ratio.

6 Claims, 2 Drawing Sheets

GAIN-PROVIDING OPTICAL POWER EQUALIZER

This application claims priority from Korean patent application number 2003-14996 filed Mar. 20, 2002 and PCT/KR03/00520 filed Mar. 20, 2003 that we incorporate herein by reference.

TECHNICAL FIELD

The present invention relates to an optical power equalizer, and more particularly to a gain-providing optical power equalizer for equalizing optical channel output or gain while amplifying signal output.

BACKGROUND ART

Typically, optical amplifiers widely used in an optical communication system have different gains with respect to different channels (i.e., different wavelengths). Provided that one channel among a plurality of channels has a relatively low gain or a relatively high gain as compared to the remaining channels, there may occur a serious problem in such optical amplifiers. In more detail, in the case where signals are attenuated or repeatedly re-amplified in an optical amplification system, such difference in gain between different channels can accumulate continuously, and thus increase to levels capable of damaging the optical amplification system. Therefore, gain flattening is needed to give different channels (i.e., different wavelengths) the same gains.

Conventionally, in order to achieve the gain flattening, there has been widely used either a method for modulating the composition of a gain medium making up the optical amplifier, or a fixed method using a gain flattening filter. However, gain characteristics of optical amplifiers vary with peripheral environments of the optical amplifiers, such that it is difficult for the fixed method to effectively cope with such variable gain characteristics of the optical amplifiers.

In order to solve this problem, there has been proposed a dynamic gain equalizer for variably equalizing the output of optical channels. The dynamic gain equalizer includes an optical branching filter (also called an optical demultiplexer) for dividing a multiplexed light source into signals of individual wavelengths, and thus generating divided optical power signals; an attenuator array for attenuating the divided optical power signals according to their channels; and an optical multiplexer for collecting channel signals equalized by an attenuator. The optical multiplexer is symmetrical to the optical branching filter functioning as the optical demultiplexer. There have been proposed a variety of modified dynamic gain equalizers using such symmetrical characteristics between the optical multiplexer and the optical demultiplexer, for example, a method for arranging a reflector at the symmetric center between them, and a method for inducing optical attenuation by inducing variations in optical phase differences, etc. Although there are a variety of modified dynamic gain equalizers, they have the same principles and are based on optical attenuation technologies. Because the gain equalizers are based on the optical attenuation technologies, they are respectively called an attenuated gain equalizer (i.e., a loss-type gain equalizer). The loss-type gain equalizer can be implemented with various methods, for example, either a construction method of the optical multiplexer and the optical demultiplexer for use with a bulk grating, an arrayed waveguide grating (AWG) or a dielectric filter, etc., or an attenuation method used for a phase interference process or an attenuator array, etc. However, the signal attenuation causes the SNR (Signal to Noise Ratio) to deteriorate in general communication systems, and therefore it is necessary for a system to equalize optical channel output or gain on the condition that there is no signal attenuation.

DISCLOSURE OF THE INVENTION

Therefore, the present invention has been made in view of the above problems, and it is an object of the present invention to provide a gain-providing optical power equalizer for equalizing optical powers for every channel simultaneously with amplifying signal output.

It is another object of the present invention to provide a gain-providing optical power equalizer for implementing power equalization for every channel without using a high-priced commercially available amplifier such as an optical fiber amplifier.

In accordance with one aspect of the present invention, the above and other objects can be accomplished by the provision of a gain-providing optical power equalization apparatus for equalizing uneven power levels of optical signals for every optical channel, comprising: an optical amplifier for providing the optical signals for every optical channel with different gains, and thus equalizing power levels for every channel of the optical signals.

Preferably, the optical amplifier may be driven by a top pumping operation.

Preferably, the gain-providing optical power equalization apparatus may further include an optical demultiplexer for dividing a power signal of an optical signal having uneven power levels for every optical channel into signals for every optical channel; and a plurality of optical paths through which the optical power signals divided by the optical demultiplexer are transmitted, wherein the optical amplifier is arranged on the plurality of optical paths, functions as an optical amplifier array for providing channels with different gains, and further includes an optical multiplexer for collecting signal channels equalized by the optical amplifier array.

Preferably, the plurality of optical paths may be waveguides each containing a gain medium, and the optical amplifier array may be an optical waveguide amplifier array. Preferably, the optical waveguide amplifier array may be driven by a top pumping operation.

Preferably, at least one of the optical demultiplexer, the optical multiplexer, and the optical amplifier array may be fabricated in the form of a PLC (Planar Lightwave Circuit).

Preferably, the gain-providing optical power equalization apparatus may further include a power meter for detecting power levels equalized by the optical amplifier according to individual channels; and a controller for adjusting amplification factors for every channel of the optical amplifier when the power meter determines that an equalization degree of the power levels is lower than a prescribed reference.

In accordance with another aspect of the present invention, there is provided a gain-providing optical power equalization apparatus, comprising: an optical circulator for directing an optical signal having uneven power levels for different optical channels in one prescribed direction only; an optical demultiplexer/multiplexer for dividing a power signal of the optical signal received from the optical circulator into signals of individual optical channels, and collecting all channel signals which are applied to the optical demultiplexer/multiplexer itself in a direction opposite to the prescribed one direction; a plurality of optical paths through which optical power signals either divided or collected by the optical demultiplexer/multiplexer are transmitted; an optical amplifier array for being arranged at an end portion of the plurality of optical paths, and providing individual channels with different gains; and a reflector for being arranged at an end portion of each unit of the optical amplifier array, and reflecting amplified optical signals.

Preferably, the optical amplifier array may be driven by a top pumping operation. Preferably, at least one of the optical demultiplexer, the optical multiplexer, and the optical amplifier array may be fabricated in the form of a PLC (Planar Lightwave Circuit).

Preferably, the gain-providing optical power equalization apparatus may further include a power meter for detecting power levels equalized by the optical amplifier according to individual channels; and a controller for adjusting amplification factors for every channel of the optical amplifier when the power meter determines that an equalization degree of the power levels is lower than a prescribed reference.

BRIEF DESCRIPTION OF THE DRAWINGS

The above and other objects, features and other advantages of the present invention will be more clearly understood from the following detailed description taken in conjunction with the accompanying drawings, in which.

BEST MODE FOR CARRYING OUT THE INVENTION

Figure 1:
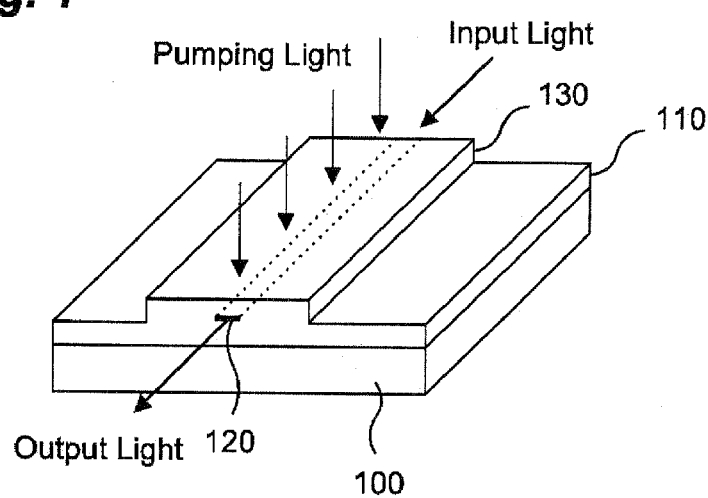
FIG. 1 is a view illustrating the appearance of an optical waveguide amplifier for use in a top process.

Now, preferred embodiments of the present invention will be described in detail with reference to the annexed drawings. In the drawings, the same or similar elements are denoted by the same reference numerals even though they are depicted in different drawings. In the following description, a detailed description of known functions and configurations incorporated herein will be omitted when it may make the subject matter of the present invention rather unclear.

Prior to describing the preferred embodiment of the present invention, an optical waveguide amplifier using a top pumping process will hereinafter be described in detail with reference to FIG. 1.

Referring to FIG. 1, a lower cladding layer 110 of silica is deposited on a substrate 100, and a core layer is formed as a waveguide 120 thereon. The core layer is made of a silica-based material doped with the nanocrystals and rare-earth elements. An upper cladding layer 130 of silica is formed on the waveguide 120. A broadband light source (not shown) is mounted on the waveguide to illuminate the downward pumping light on the waveguide 120. The light entering the waveguide 120 creates electrons and hole in nanocrystals that recombine, resulting in excitation of rare-earth elements. The input light receives energy from the excited rare-earth element, is amplified while passing through the waveguide 120, and is thus converted into output light.

Figure 2:
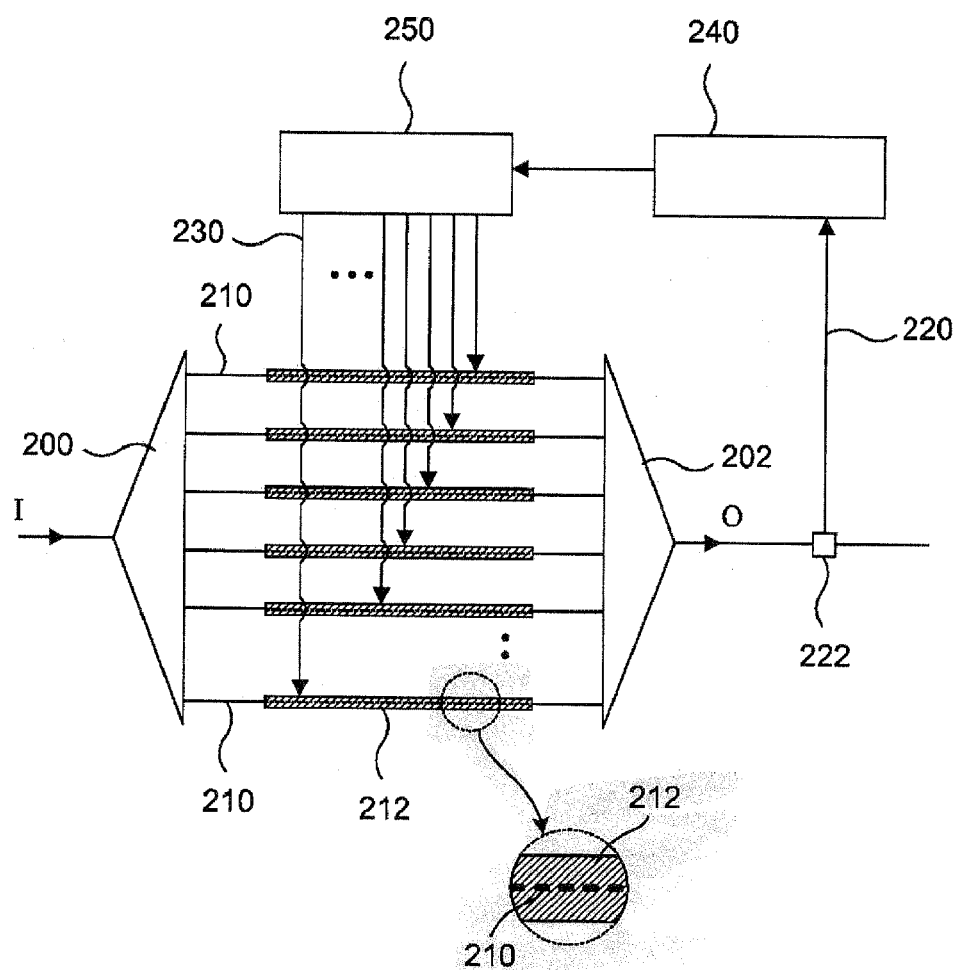
FIG. 2 is a conceptual block diagram of an optical power equalizer in accordance with a preferred embodiment of the present invention.

FIG. 2 is a conceptual block diagram of an optical power equalizer in accordance with a preferred embodiment of the present invention.

Referring to FIG. 2, an optical signal having uneven power levels for every channel is applied to an input terminal I of a demultiplexer 200 comprised of planar gratings. The input optical signal is the multi-wavelength optical signal (also called a multi-wavelength light signal), which is transmitted over an optical communication system or amplified by an optical amplifier having an uneven gain curve. The multi-wavelength optical signal is divided into signals for every optical channel by diffraction in a demultiplexer 200 functioning as an optical demultiplexer of planar gratings, and divided optical powers enter the waveguides 210 corresponding to a plurality of optical paths. In the meantime, a multiplexer 202 comprised of planar gratings, functioning as an optical multiplexer, performs other operations in opposition to those of the aforementioned demultiplexer 200. Some parts of the waveguide 210 are the same as those of FIG. 1. Pump light sources 212 for every waveguide are arranged on their waveguides to perform the top pumping. Therefore, this arrangement corresponds to an optical waveguide amplifier configuration. Individual pump light sources 212 receive different power signals 230 from a controller 250, such that an optical amplification degree can be differently set up for every waveguide 210. Provided that divided optical power levels are different for every waveguide 210, an optical signal of a low optical power level is highly amplified, and the other optical signal of a high optical power level is lightly amplified, thereby implementing an optical power equalizer for providing individual waveguides with flattened gains. In this way, flattened optical powers for every channel (i.e., every waveguide) are collected by the multiplexer 202, and therefore collected signals are transmitted over an output terminal O. In accordance with this preferred embodiment of the present invention, some signals 220 extracted from the optical signals transmitted over the output terminal O by means of a coupler 222, and then transmitted to an OSA (Optical Spectrum Analyzer) 240 functioning as an optical power meter, such that the OSA 240 measures optical power levels for every channel and transmits the measured information to the controller 250. In the case where the controller 250 determines that individual flattened degrees of the output optical signals do not reach a desired flattened degree, power levels 230 applied to pump light sources 212 for every channel are adjusted to obtain the desired flattened degree in all the optical signals, resulting in dynamic optical power equalization. It is desirable that the demultiplexer 200, the multiplexer 202, and the waveguides 210 adapted to the aforementioned preferred embodiment are fabricated in the form of PLC (Planar Lightwave Circuit).

In accordance with the aforementioned preferred embodiment, optical power signals for every channel are collected by the multiplexer 202, and then some signals are extracted from all optical signals transmitted over the output terminal O by means of the coupler 222, in such a way that the above preferred embodiment can measure optical power levels for every channel. However, provided that an appropriate optical extractor or detector is provided, an amplified optical signal can be directly extracted from the waveguides 210 after optical amplification has been completed.

Figure 3:
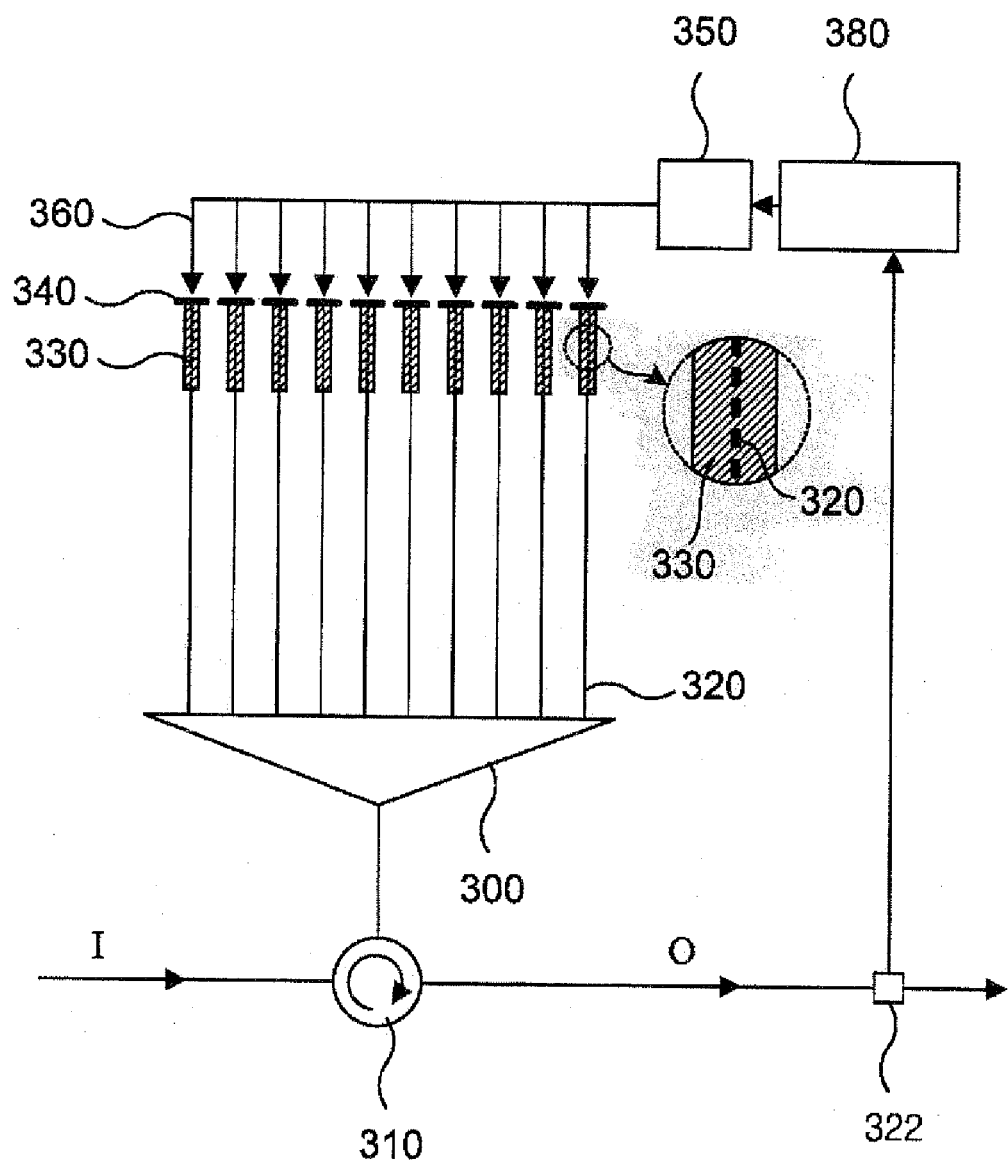
FIG. 3 is a conceptual block diagram of an optical power equalizer in accordance with another preferred embodiment of the present invention.

FIG. 3 is a conceptual block diagram of an optical power equalizer in accordance with another preferred embodiment of the present invention.

It should be noted that the optical power equalizer shown in FIG. 3 is based on the symmetrical configuration between the demultiplexer 200 and the multiplexer 202. The optical power equalizer of FIG. 3 uses an optical demultiplexer/multiplexer 300 functioning as both a demultiplexer and a multiplexer, whereas the demultiplexer 200 and the multiplexer 202 are separated from each other in FIG. 2. As shown in FIG. 3, an optical signal having uneven power levels for every channel is applied to an input terminal I. The input optical signal is the multi-wavelength optical signal, which is transmitted over an optical communication system or amplified by an optical amplifier having an uneven gain curve. The input optical signal enters an optical demultiplexer/multiplexer 300 over an optical circulator 310 adapted to direct the input optical signal toward a prescribed one direction. In the case where the optical circulator 310 directs its received optical signal to the optical demultiplexer/multiplexer 300, the optical demultiplexer/multiplexer 300 functions as an optical demultiplexer. However, in the case where the optical circulator 310 does not direct its received optical signal to the optical demultiplexer/multiplexer 300, the optical demultiplexer/multiplexer 300 functions as an optical multiplexer. Therefore, the optical signal applied to the optical demultiplexer/multiplexer 300 over the optical circulator 310 are divided into signals for every channel, and power levels of divided optical signals are applied to the waveguides 320 corresponding to a plurality of optical paths. The rear parts of the waveguides 320 are the same as those of FIG. 2. Pump light sources 330 for every waveguide are arranged on their waveguides to perform the top pumping. Therefore, this arrangement corresponds to an optical waveguide amplifier array configuration. Individual pump light sources 330 receive different power signals 360 from a controller 350, such that an optical amplification degree can be differently set up for every waveguide 320. Provided that divided optical power levels are different for every waveguide 210, an optical signal of a low optical power level is highly amplified, and the other optical signal of a high optical power level is lightly amplified, thereby implementing an optical power equalizer for providing individual waveguides 320 with flattened gains. The pump light sources 330 are arranged at even end portions of individual waveguides 320, mirrors 340 are arranged to be brought into contact with individual pump light sources 330, such that optical power signals primarily amplified are re-amplified by reflection from the mirrors 340. These optical power signals fed back to the optical demultiplexer/multiplexer 300 after they have been amplified two times are collected by the optical demultiplexer/multiplexer 300, and then transmitted to an output terminal O. On the other hand, some signals are extracted from the optical signals transmitted over the output terminal O by means of a coupler 322, and then transmitted to an OSA (Optical Spectrum Analyzer) 380 functioning as an optical power meter, such that the OSA 380 measures optical power levels for every channel and transmits the measured information to the controller 350. In the case where the controller 350 determines that individual flattened degrees of the output optical signals do not reach a desired flattened degree, power levels 360 applied to pump light sources 330 for every channel are adjusted to obtain the desired flattened degree in all the optical signals, resulting in dynamic optical power equalization. It is desirable that the optical demultiplexer/demultiplexer 300 and the waveguides 320 used in the above second preferred embodiment are fabricated in the form of PLC (Planar Lightwave Circuit).

Although the aforementioned preferred embodiments of the present invention have described only a gain-providing optical power equalizer, the present invention can be applicable to the loss-type optical power equalizer on the condition that the waveguide length is differently set up according to optical power levels for every channel without operating the pump light sources. The reason why there is no need for the pump light sources to be driven is that optical attenuation caused by optical absorption varies with the length of optical waveguide. That is, the optical power equalizer according to the present invention can be easily used in the same manner as in the conventional art.

INDUSTRIAL APPLICABILITY

As apparent from the above description, according to the present invention, the output of optical channels can be adjusted to be flat or as desired without deteriorating the signal to noise ratio (SNR).

Although the present invention has been described in connection with specific preferred embodiments, those skilled in the art will appreciate that various modifications, additions, and substitutions to the specific elements are possible, without departing from the scope and spirit of the present invention as disclosed in the accompanying claims.

The invention claimed is:

1. A gain-providing optical power equalization apparatus for equalizing uneven power levels of optical signals for every optical channel, comprising:

an optical amplifier array comprising a plurality of optical amplifiers for providing the optical signals for every optical channel with different gains, and thus equalizing power levels for every channel of the optical signals;

an optical demultiplexer for dividing a power signal of an optical signal having uneven power levels for every optical channel into signals for every optical channel; and a plurality of optical paths through which the optical power signals divided by the optical demultiplexer are transmitted, an optical multiplexer for collecting signal channels equalized by the optical amplifier array;

wherein the optical amplifiers are arranged on the plurality of optical paths, wherein the plurality of optical paths are waveguides each containing a gain medium, and the optical amplifier array is an optical waveguide amplifier array, wherein the gain medium is made of a silica-based material doped with nanocrystals and rare-earth elements, wherein the optical amplifier is a pump light source disposed above the waveguide having the gain medium, and wherein the optical waveguide amplifier array is driven by a top pumping operation.

2. The apparatus as set forth in claim 1, wherein at least one of the optical demultiplexer, the optical multiplexer, and the optical amplifier array is fabricated in the form of a PLC (Planar Lightwave Circuit).

3. The apparatus as set forth in claim 1, further comprising:

a power meter for detecting power levels equalized by the optical amplifier according to individual channels; and a controller for adjusting amplification factors for every channel of the optical amplifier when the power meter determines that an equalization degree of the power levels is lower than a prescribed reference.

4. A gain-providing optical power equalization apparatus for equalizing uneven power levels of optical channel, comprising:

an optical circulator for directing an optical signal having uneven power levels for different optical channels in one prescribed direction only;

an optical demultiplexer/multiplexer for dividing a power signal of the optical signal received from the optical circulator into signals of individual optical channels, and collecting all channel signals which are applied to the optical demultiplexer/multiplexer itself in a direction opposite to the prescribed one direction;

a plurality of optical paths through which optical power signals either divided or collected by the optical demultiplexer/multiplexer are transmitted, wherein the plurality of optical paths are waveguides and each waveguide contains a gain medium, and wherein the gain medium is made of a silica-based material dopes with nanocrystals and rare-earth elements;

a top-pumping type optical amplifier array for being arranged at an end portion of the plurality of optical paths, and providing individual channels with different gains, wherein the optical amplifier array includes a pump light source disposed above the waveguide having the gain medium; and a reflector for being arranged at an end portion of each unit of the optical amplifier array, and reflecting amplified optical signals.

5. The apparatus as set forth in claim 4, wherein at least one of the optical demultiplexer, the optical multiplexer, and the optical amplifier array is fabricated in the form of a PLC (Planar Lightwave Circuit).

6. The apparatus as set forth in claim 4, further comprising:

a power meter for detecting power levels equalized by the optical amplifier according to individual channels; and a controller for adjusting amplification factors for every channel of the optical amplifier when the power meter determines that an equalization degree of the power levels is lower than a prescribed reference.

* * * * *